(12) United States Patent
Weidinger et al.

(10) Patent No.: US 10,993,313 B2
(45) Date of Patent: Apr. 27, 2021

(54) NON-UNIFORM MAGNETIC FOIL EMBEDDED IN COMPONENT CARRIER

(71) Applicant: AT&S Austria Technologie & Systemtechnik Aktiengesellschaft, Leoben (AT)

(72) Inventors: Gerald Weidinger, Leoben (AT); Jonathan Silvano de Sousa, Vienna (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/051,204

(22) Filed: Jul. 31, 2018

(65) Prior Publication Data

US 2019/0045624 A1 Feb. 7, 2019

(30) Foreign Application Priority Data

Aug. 2, 2017 (EP) .................................. EP17184547

(51) Int. Cl.
  *H05K 1/02* (2006.01)
  *H05K 3/46* (2006.01)
  *H05K 1/18* (2006.01)

(52) U.S. Cl.
  CPC ......... *H05K 1/0233* (2013.01); *H05K 1/0224* (2013.01); *H05K 1/188* (2013.01); *H05K 3/4658* (2013.01); *H05K 1/0225* (2013.01); *H05K 1/0227* (2013.01); *H05K 2201/0723* (2013.01); *H05K 2201/083* (2013.01)

(58) Field of Classification Search
  CPC .... H05K 1/0233; H05K 1/0224; H05K 1/188; H05K 3/4658; H05K 1/0227; H05K 1/0225
  See application file for complete search history.

(56) References Cited

U.S. PATENT DOCUMENTS

| | | | | |
|---|---|---|---|---|
| 2,900,580 | A * | 8/1959 | Beck | .................... H05K 3/4685 |
| | | | | 174/262 |
| 5,966,294 | A | 12/1999 | Harada et al. | |
| 7,071,422 | B2 * | 7/2006 | Droz | ................. G06K 19/07749 |
| | | | | 174/260 |
| 8,125,793 | B2 * | 2/2012 | Rytky | .................... H05K 1/144 |
| | | | | 361/792 |

(Continued)

FOREIGN PATENT DOCUMENTS

| | | |
|---|---|---|
| CN | 1452764 A | 10/2003 |
| CN | 1135574 C | 1/2004 |

(Continued)

OTHER PUBLICATIONS

Zheng, M; Office Action in Application No. 2018108694112; dated Sep. 2020, pp. 1-11; China National Intellectual Property Administration; 100088, Haidian District, Beijing, China.

(Continued)

*Primary Examiner* — Nathan Milakovich
(74) *Attorney, Agent, or Firm* — Robert A. Blaha; Smith Tempel Blaha LLC (57) ABSTRACT

A component carrier including a stack with a plurality of electrically insulating layer structures and/or a plurality of electrically conductive layer structures, and a non-uniform magnetic foil integrated in the stack.

17 Claims, 5 Drawing Sheets

(56) References Cited

U.S. PATENT DOCUMENTS

| | | | | |
|---|---|---|---|---|
| 8,134,084 | B2* | 3/2012 | Kawaguchi | H05K 1/0234 174/262 |
| 8,191,230 | B2* | 6/2012 | Coleman | G06K 19/07718 29/600 |
| 9,251,458 | B2* | 2/2016 | Finn | G06K 19/07769 |
| 10,410,963 | B1* | 9/2019 | Weis | H01L 23/4985 |
| 2003/0062965 | A1 | 4/2003 | Jensen | |
| 2003/0169039 | A1 | 9/2003 | Kang et al. | |
| 2003/0175540 | A1* | 9/2003 | White | G06K 19/06196 428/542.2 |
| 2008/0136574 | A1 | 6/2008 | Jow et al. | |
| 2014/0209691 | A1 | 7/2014 | Finn et al. | |
| 2017/0172020 | A1* | 6/2017 | Ye | H05K 9/0081 |
| 2018/0359885 | A1* | 12/2018 | Woo | H01Q 7/06 |

FOREIGN PATENT DOCUMENTS

| | | |
|---|---|---|
| CN | 101480112 A | 7/2009 |
| CN | 102006727 A | 4/2011 |
| CN | 103929899 A | 7/2014 |
| CN | 104602451 A | 5/2015 |
| DE | 10162637 C1 | 8/2003 |
| EP | 0785557 A1 | 7/1997 |
| JP | 2004039676 A * | 2/2004 |

OTHER PUBLICATIONS

English Translation of Office Action in Application No. 2018108694112; dated Sep. 22, 2020; pp. 1-3; China National Intellectual Property Administration; 100088, Haidian District, Beijing, China.

Translation of Search Report in Application No. 2018108694112; dated Sep. 4, 2020, pp. 1-3; China National Intellectual Property Administration; 100088, Haidian District, Beijing, China.

Translation of Examiner Comments in First Office Action in Application No. 2018108694112; dated Sep. 22, 2020; pp. 1-3; China National Intellectual Property Administration; 100088, Haidian District, Beijing, China.

* cited by examiner

NON-UNIFORM MAGNETIC FOIL EMBEDDED IN COMPONENT CARRIER

TECHNICAL FIELD

The invention relates to a method of manufacturing a component carrier, and to a component carrier.

BACKGROUND

In the context of growing product functionalities of component carriers, in particular those equipped with one or more electronic components, and increasing miniaturization as well as a rising demand of functionality of component carriers, increasingly more powerful component carriers are being employed, which have a plurality of contacts or connections, with ever smaller spacing between these contacts. Also an efficient protection against electromagnetic interference (EMI) becomes an increasing issue. At the same time, component carriers shall be mechanically robust and electrically reliable so as to be operable even under harsh conditions. Moreover, an extended functionality of component carriers is demanded by users.

SUMMARY

There may be a need to provide a component carrier allowing for an efficient and reliable operation while enabling a high degree of functionality.

A method of manufacturing a component carrier, and a component carrier according to the independent claims are provided.

According to an exemplary embodiment of the invention, a component carrier is provided which comprises a stack of a plurality of electrically insulating layer structures and/or a plurality of electrically conductive layer structures, and a non-uniform magnetic foil integrated in the stack.

According to another exemplary embodiment of the invention, a method of manufacturing a component carrier is provided, wherein the method comprises connecting a stack of a plurality of electrically conductive layer structures and/or a plurality of electrically insulating layer structures, and non-uniformly integrating a (in particular connected, at least at the time of integration) magnetic foil in the stack.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In the context of the present application, the term "non-uniform magnetic foil" may particularly denote a layer, film or sheet consisting of or comprising magnetic material deviating from a purely continuous planar shape. Such a non-uniform magnetic foil may for instance be a magnetic foil having one or more interior and/or exterior recesses (such as through holes and/or blind holes) and/or being three dimensionally bent (i.e. being not fully located within one plane). A non-uniform magnetic foil may constitute one common or connected integral structure or may be composed of multiple separate no longer connected islands (which may have been separated on the basis of an initially continuous foil).

In the context of the present application, the term "integrated in the stack" may particularly denote that the non-uniform magnetic foil may be arranged partially or entirely embedded within an interior of a connected (in particular laminated) stack of component carrier material, in particular PCB (printed circuit board) material.

According to an exemplary embodiment of the invention, a magnetic foil is embedded in a stack of electrically insulating layer structures (for instance comprising a resin, optionally in combination with reinforcing particles such as fibers) and/or electrically conductive layer structures (for instance copper foils) in a way that the magnetic foil is arranged in and/or on a corresponding stack in a spatially non-uniform manner. Implementing such an embedding process has the advantageous effect that the magnetic foil is securely connected within and protected by the component carrier material, thereby providing high mechanical stability. Simultaneously and synergistically, the non-uniform shape of the magnetic foil allows tailoring the magnetic foil in accordance with a specific magnetic and/or electric function or electromagnetic radiation shielding function in the component carrier. For instance, the non-uniform magnetic foil may at least partially surround an electromagnetic radiation emitting and/or electromagnetic radiation sensitive component embedded in the component carrier to reduce or even eliminate issues concerning electromagnetic interference (EMI). It is also possible that the non-uniform magnetic foil forms part of an inductor, for instance constitutes a ferrite core cooperating with a coil integrated in a component carrier. Thus, the non-uniform magnetic foil may form part of an inductor embedded in the component carrier. The non-uniform design of the magnetic foil in the component carrier may also be adjusted under consideration of other boundary conditions, such as the need to form vertical interconnects in an interior of the component carrier protruding through the magnetic foil without forming parasitic electrically conductive paths.

In the following, further exemplary embodiments of the method and the component carrier will be explained.

In an embodiment, the non-uniform magnetic foil is a patterned magnetic foil. Such patterning can be carried out advantageously using a mechanical abrasion technique, since removing portions of a (in particular previously continuous) magnetic foil by mechanically processing the foil (for instance by milling or drilling) is compatible with substantially any material of the magnetic foil (in contrast to a patterning based on photolithography and etching, which is for instance not possible with magnetic oxide type magnetic foils or magnetic foils being provided as a polymer matrix with magnetic particles, for instance of ferrite, embedded therein). By patterning, portions of the magnetic foil may be removed in which it is desired that the magnetic foil is not present for a certain application. For instance, such portions being free of magnetic material may be advantageous where electrically conductive vertical connection elements are formed which shall not be in contact with the magnetic foil.

Additionally or alternatively, the magnetic foil may be a three-dimensionally bent foil. By three-dimensionally bending the magnetic foil for establishing a non-uniform property thereof, spatial regions and/or spatial directions in which the magnetic foil is functionally operative can be precisely adjusted. For instance, a three-dimensionally bent magnetic foil having a slanted or vertical transition section between two horizontal sections may allow providing a lateral electromagnetic radiation shielding function.

In an embodiment, the magnetic foil is configured as a single continuous magnetic foil structure. The formation of the magnetic foil as an integrally connected structure simplifies handling of the magnetic foil which can simply be treated as one piece during the manufacturing process. This property is also advantageous during the embedding (for instance laminating) process, since the connected magnetic foil does not comprise multiple separate islands which need to be handled separately or which tend to spatially migrate into unintentional regions, thereby deteriorating spatial accuracy.

More specifically, the magnetic foil may be provided as a single continuous magnetic foil structure at least at the beginning of the manufacturing process. In such an embodiment, the magnetic foil can be laminated as a sheet together with other layer structures (such as prepreg layers and copper foils), for instance all having the same sheet dimension. This is easily possible using standard PCB technology. Patterning may be accomplished after pressing such as single continuous magnetic foil together with the other layer structures. Thus, registration accuracy may be significantly increased compared to an approach in which individual small pieces of magnetic material are embedded in larger panels of prepreg and copper.

In another embodiment, the magnetic foil is configured as an arrangement of multiple separate island structures in the readily manufactured component carrier. By taking this measure, also very specific and/or spatially limited magnetic tasks may be fulfilled by the magnetic foil without limiting the freedom of design of other portions of a component carrier. In particular in such an embodiment, it may be highly advantageous to first embed a continuous complete magnetic foil with other layer structures to form an interconnected stack, and to form the separate magnetic islands later, in order to obtain high registration accuracy.

In a preferred embodiment, the magnetic foil comprises a polymer matrix and magnetic particles, in particular ferrite particles, embedded in the polymer matrix. Alternatively, the magnetic foil comprises a magnetic oxide (for instance ferric oxide, magnetite, etc.) material. A magnetic foil formed on the basis of a polymer matrix and magnetic particles has the significant advantage of being freely bendable so that the non-uniformity of the embedded magnetic foil can be freely adjusted. Moreover, when processing such a polymer matrix with embedded magnetic particles, for instance in terms of patterning the corresponding magnetic foil, it is highly advantageous to use a mechanical abrasion procedure (such as milling) or laser processes, since such a material is not compatible with etching. Similar considerations apply for magnetic oxide materials.

In an embodiment, the component carrier further comprises at least one (in particular vertical) through-connection extending through at least part of the stack and the magnetic foil. In particular, the (in particular vertical) through-connection may be separated from the magnetic foil by material of the electrically insulating layer structures (such as resin, in particular epoxy resin, with reinforcing particles, in particular glass fibers, for instance prepreg or FR4). Correspondingly, the method may comprise forming at least one electrically conductive through-connection extending through at least part of the stack and the magnetic foil. Advantageously, the (preferably vertical) through-connection may be separated from the magnetic foil by material of at least one of the electrically insulating layer structures. When the magnetic foil is provided with a through hole, a vertical through-connection (such as a copper via) may be guided through this through hole to accomplish an electric coupling between electrically conductive structures or components above and below the magnetic foil without generating undesired electric paths. Thus, the presence of the embedded magnetic foil can made compatible with electric boundary conditions in the component carrier.

In an embodiment, the magnetic foil comprises at least one the group consisting of a permanent magnetic material, a soft magnetic material, and a ferrite material. A permanent magnetic material may be ferromagnetic material or ferrimagnetic material, and may for instance be provided on the basis of transition metals (with partially filled 3d shell) such as iron or nickel, or on the basis of rare earths (with partially filled 4f shell). A soft magnetic material may be a material which can be easily re-magnetized, i.e. having a small area of its hysteresis curve. In other words, soft magnetic materials are those materials that are easily magnetized and demagnetized. They may have intrinsic coercivity less than 1000 $Am^{-1}$. A ferrite may be denoted as a type of ceramic compound composed of $Fe_2O_3$ combined chemically with one or more additional metallic elements. Ferrites are both electrically non-conductive and ferrimagnetic, so they can be magnetized or attracted by a magnet. Ferrites may be implemented as hard ferrites or soft ferrites, depending on an application.

In an embodiment, the magnetic material of the magnetic foil has a relative magnetic permeability, $\mu_r$, of at least 10, in particular at least 1000. Magnetic permeability may be denoted as a measure of the ability of a material to support the formation of a magnetic field within itself. Hence, it is the degree of magnetization that a material obtains in response to an applied magnetic field.

In an embodiment, the magnetic foil is sandwiched between a first portion of the stack and a second portion of the stack. By taking this measure, the magnetic foil is properly protected against influences from the environment. Moreover, by locating the magnetic foil in an interior of the stack rather that at a surface thereof, the magnetic foil can fulfil its function directly at a desired location, thereby contributing to the compactness of the component carrier as a whole.

In an embodiment, the magnetic foil is configured for shielding electromagnetic radiation from propagating within the component carrier or within the stack (for instance from a first portion of the stack to a second portion of the stack). The magnetic foil may however also be configured for shielding electromagnetic radiation from propagating between a component carrier and an environment. Such a shielding may include a prevention of electromagnetic radiation from propagating from an exterior of the component carrier to an interior of the component carrier, from an interior of the component carrier to an exterior of the component carrier, and/or between different portions of the component carrier. In particular, such a shielding may be accomplished in a lateral direction of the stack (i.e. horizontally) and/or in a stacking direction of the stack (i.e. vertically). In such an embodiment, the magnetic foil may function for shielding electromagnetic radiation to thereby suppress undesired effects of electromagnetic interference (EMI), in particular in the radiofrequency (RF) regime. For instance, an embedded component of the component carrier arranged in the first portion of the stack may be a source of electromagnetic radiation to be shielded in order to prevent or at least suppress propagation of the electromagnetic radiation to the second portion of the stack (where for instance a radiation sensitive further embedded component may be located). It is also possible that electromagnetic radiation, such as radio frequency radiation, propagates into the stack and shall be prevented from reaching a radiation sensitive portion of the stack (for instance a component embedded therein).

In another embodiment, the component carrier comprises an inductor (for instance an embedded inductor), wherein the magnetic foil forms part of the inductor (in particular forms at least part of a core of the inductor). For instance, a ferromagnetic core inductor (such as an iron core inductor) may use a magnetic core made of a ferromagnetic or ferrimagnetic material such as iron or ferrite to increase the inductance. Thus, at least part of the non-uniform magnetic foil may form part of a magnetic core of an inductor, for instance for manufacturing a transformer or the like. Embedding the magnetic foil in (in particular an interior of) the stack also allows forming an embedded inductor in which the magnetic foil or part thereof forms a (for instance ferrite) core of the inductor.

In an embodiment, the magnetic foil is rendered non-uniform by removing material of the magnetic foil by mechanical abrasion (for instance by milling, drilling, grinding, etc.) or laser cutting. Several in particular bendable magnetic foils, which are highly appropriate as non-uniform magnetic foils, cannot be appropriately patterned by etching. An example is a flexible film composed of a polymer matrix with magnetic particles (for example ferrite particles) therein. However, it turned out that also such foil-type magnetic materials can be patterned (for instance for forming one or more through holes and/or blind holes and/or for separating the magnetic foil into multiple separate magnetic islands) properly by a subtractive procedure which is based on a mechanical impact on the magnetic foil removing material thereof. Thus, patterning a magnetic foil by mechanically processing is a powerful tool for freely designing non-uniform magnetic foils in terms of shape adjustment, adjusting patterning properties and in terms of material selection.

In a preferred embodiment, the magnetic foil is rendered non-uniform by milling a (in particular previously continuous) foil, in particular by one of depth milling and contact milling.

In the context of the present application, the term "milling" may in particular denote a machining process of using a milling tool having one or more rotary cutters to remove material from the stack as workpiece by advancing the milling tool in a direction at an angle with the axis of the milling tool.

More specifically, the term "depth milling" may particularly denote a milling process in which the depth of the milling of the component carrier or preform thereof is controlled by controlling a milling tool in a vertical direction perpendicular to a main surface of the component carrier being manufactured. Depth milling may involve a control unit controlling depth of etching in the vertical or z-direction.

Beyond this, the term "depth milling" may particularly denote a milling process in which a mechanical contact between a bottom of a milling tool (in particular a rotary cutter) and a stop layer of the stack at which the milling procedure shall be terminated can be detected electrically, and the milling tool can be controlled in accordance with the electric detection. In such a depth milling process, the event of the (in particular electrically conductive) tip of the milling tool touching the (in particular electrically conductive) stop layer of the stack (for instance a copper foil of the stack below the magnetic foil) can be detected electrically by providing an electric circuit which is closed by the milling tool upon touching the stop layer. Thus, an electric signal indicative of the completion of the milling procedure in the vertical direction may prevent undesired excessive milling and thereby allows manufacturing a component carrier with highly accurate properties.

In an embodiment, the magnetic foil is rendered non-uniform by laser processing a (in particular previously continuous) foil, in particular by laser drilling. Thus, it is possible to pattern the magnetic foil by a laser treatment with high speed. In an embodiment, the method comprises processing the magnetic foil by arranging part of the magnetic foil on or above a release structure, forming an annular through-hole through the magnetic foil extending at least up to the release structure, and removing a portion of the magnetic foil within the annular through-hole. Such a release layer may a patterned layer structure (for instance made of a waxy material or based on Teflon®) on which other component carrier material of the stack, including the magnetic foil, does not properly adhere. Cutting a circumferentially closed hole above such a release layer may therefore allow removal of a piece of the magnetic foil above the release layer to thereby complete formation of the patterned magnetic foil. Teflon® is a registered trademark of The Chemours Company FC, LLC Wilmington, Delaware, U.S.A.

In an embodiment, the method comprises forming the annular through-hole by one of the group consisting of mechanically cutting and laser cutting. Such a process may be easily controlled and allows manufacturing structured magnetic foils with high freedom of design.

In an embodiment, the method comprises processing the magnetic foil by providing a first body and a (for instance laterally juxtaposed or laterally overlapping or even to be vertically stacked) second body comprising component carrier material (for instance each comprising at least one electrically insulating layer structure and/or at least one electrically conductive layer structure), and guiding the magnetic foil along one of the bodies, through a gap between the bodies up to the other of the bodies to thereby three-dimensionally bend the magnetic foil. The first body and the second body may for instance be separate bodies or may be portions of a common body being delimited by a gap (such as a slit). In such embodiments, the shape of the three-dimensional bending can be defined by the shape of the two cooperating component carrier bodies along which the magnetic foil can be precisely guided. At the gap between the bodies, the foil may be also arranged slanted or even vertical so that even a lateral shielding of electromagnetic radiation can be made possible.

In an embodiment, the magnetic foil is guided from an upper main surface of the first body via the gap to a lower main surface of the second body so that a central portion of the magnetic foil is slanted in the gap with regard to the (preferably parallel) main surfaces. This makes it possible to provide a lateral shielding function without any substantial modification of the lamination process of laminating the three-dimensionally bent magnetic foil and the layer structures together. Upon laminating (i.e. application of pressure and/or heat), the magnetic foil portions on the opposing main surfaces of the bodies will be laminated together with the adjacent layer structures, while the intermediate slanted or vertical magnetic foil portion is simultaneously pressed between the bodies.

In an embodiment, the first body and the second body are each formed with a respective one of two cooperating surface profiles. The magnetic foil may be guided along both surface profiles so as to be three-dimensionally bent. For instance, the surface profiles may be cooperating steps of the bodies. The surface profiles of the bodies may be shaped and dimensioned so that they can be connected to one another with form closure. Descriptively speaking, the surface profiles of the bodies may be formed like cooperating puzzle pieces. By providing such cooperating surface profiles, the accuracy of guiding the (in particular flexible, elastic and/or bendable) magnetic foil along a defined trajectory in an interior of the formed component carrier may be further improved. The freedom of implementing one or more additional magnetic functions in the component carrier may therefore be increased.

In an embodiment, the first body and the second body together form the stack when assembled. In particular, the first body and the second body may be adapted so as to form a plate-like structure when assembled. When taken individually, the first body in the second body may each form plate-like structures as well, or may form structures with cooperating surface profiles which constitute the plate-like structure only upon assembly.

In an embodiment, the method further comprises laminating the magnetic foil on a first portion of the stack and subsequently laminating a second portion of the stack on the first portion of the stack and on the magnetic foil. Thus, the magnetic foil may be first laminated on layer structures forming part of the stack, preferably as a continuous magnetic foil. The magnetic foil, still being exposed, may then be processed (in particular by a mechanical abrasive method such as milling or laser processes) to render it non-uniform in accordance with a desired magnetic application. Thereafter, the so obtained structure may be laminated together with further layer structures of the stack, so that the magnetic foil may be embedded in an interior of the readily formed component carrier.

In an embodiment, the method further comprises connecting the magnetic foil on at least one of the layer structures, and subsequently removing part of the material of the magnetic foil. This order of processing makes it possible to connect the magnetic foil in form of a sheet having the same size as sheets constituting the electrically conductive layer structures and electrically insulating layer structures of the stack. For instance, the sheets may have panel size (for instance 18 inch×12 inch). When such sheets are laminated together, no alignment or registration issues occur. By only subsequently patterning the already laminated magnetic foil, even tiny magnetic structures may be formed precisely located at desired target positions on the stack. By patterning using a mechanical abrasion method substantially all types of magnetic materials may be precisely processed.

In an embodiment, removing part of the material of the magnetic foil comprises separating the magnetic foil into separate islands. Thus, the magnetic foil does not necessarily form a continuous structure in the final component carrier, but can be composed of several discontinuous sub-structures or islands which may for instance be all located in the same plane.

In an embodiment, the method comprises providing a magnetic foil being flexibly bendable prior to integrating the magnetic foil in the stack. Such a bendable foil may be an elastically bendable foil and/or a plastically deformable foil.

At least one component may be surface mounted on or embedded in the component carrier. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna structure, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite coupling structure) or may be a paramagnetic element. However, the component may also be a further component carrier, for example in a board-in-board configuration. The component may be surface mounted on the component carrier and/or may be embedded in an interior thereof. Moreover, also other components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminate-type body. In such an embodiment, the component carrier is a compound of multiple layer structures which are stacked and connected together by applying a pressing force, if desired accompanied by heat.

BRIEF DESCRIPTION OF THE DRAWINGS

Embodiments of the component carrier can be better understood with reference to the following drawings. The elements and features in the drawings are not necessarily to scale, emphasis instead being placed upon clearly illustrating the structures and principles of operation of the assemblies.

DETAILED DESCRIPTION OF ILLUSTRATED EMBODIMENTS

The illustrations in the drawings are schematically presented. In different drawings, similar or identical elements are provided with the same reference signs.

The aspects defined above and further aspects of the invention are apparent from the examples of embodiment to be described hereinafter and are explained with reference to these examples of embodiment.

Before, referring to the drawings, exemplary embodiments will be described in further detail, some basic considerations will be summarized based on which exemplary embodiments of the invention have been developed.

According to an exemplary embodiment of the invention, one or more (in particular integral or connected, or separated into separate islands) magnetic layers are embedded in a component carrier in such a way that the one or more magnetic layers have a non-uniform shape or structure.

It is been found that magnetic foils (such as ferrite foils, soft magnetic foils, foils on the basis of nano-crystalline magnetic materials, etc.) have proper adhesion properties in relation to component carrier material, in particular resin sheets such as prepreg. At the same time, such magnetic foils meet even challenging reliability requirements of component carriers.

When embedding such magnetic foils in a component carrier material, it may be required to cut out certain structures and to locate a non-uniform magnetic foil at a correct position within a panel as a preform of component carriers such as printed circuit boards (PCB). This is required in order to find the correct position of the magnetic foil or parts thereof in the interior of the panel later.

In order to make this possible, the position of the magnetic foil on a carrier may be defined, and the magnetic foil may be subsequently patterned by a subtractive method until only the desired structure of the non-uniform magnetic foil remains.

For instance, a corresponding manufacturing method may involve the following procedures:

1. Laminating, in particular by applying pressure, the magnetic foil with a prepreg foil as electrically insulating layer structure and a copper foil as electrically conductive layer structure.
2. Generating the non-uniform structure of the magnetic foil by milling, in particular depth milling, contact milling or laser milling. During this process, the magnetic foil may be completely removed in milled portions. For instance, one or more interior through holes may be formed in the magnetic foil by milling and/or the magnetic foil may be separated into separate portions.
3. Thereafter, it is possible to laminate, in particular by applying pressure, the obtained layer structure with a further electrically insulating layer structure (for instance a further prepreg foil) and a further electrically conductive layer structure (in particular a further copper foil) on the magnetic (for instance ferrite) side of the composite. It is additionally or alternatively also possible to use a resin coated copper (RCC) foil, a bonding sheet, etc. for this purpose. A RCC foil is a copper foil coated with resin material, for instance epoxy resin, and therefore comprises an electrically conductive copper layer and two electrically insulating resin layers thereon. It is also possible to provide an electrically insulating resin layer only on one main surface of the mentioned copper layer.
4. Thereafter, additional component carrier manufacturing procedures depending on the characteristic of the component carrier (in particular printed circuit board) to be formed can be carried out (for instance patterning, drilling, plating, laminating, etc.).

During processing of the magnetic foil in terms of the manufacturing process of an exemplary embodiment of the invention, it is possible to form one or more fiducials, alignment markers or registration markers. When needed, they can be found by X-ray drilling and can be used for the further patterning and other manufacturing processes. In case of an insufficient filling of the structures, it is possible to remove copper by etching after the second pressing or lamination process, and press or laminate the composite again. In an embodiment, in which very thin compounds shall be manufactured, it is possible to implement one or more RCC foils in combination with contact milling. For instance, it is possible to use a thicker (for instance 70 µm or more) copper foil in combination with a thinner (for instance less than 50 µm) further copper foil and in combination with an adhesive foil (for example a UV release adhesive foil). It should be emphasized that, in such an embodiment, a connected carrier layer may remain under the magnetic foil (for instance ferrite structure) after milling, which can be removed again after the second lamination or pressing procedure. Also in such a scenario, it is possible to subsequently etch copper material and repeat the pressing or lamination procedure (for instance if an upper resin layer is not sufficient for filling). Additionally or alternatively, it is also possible that copper is applied again, for instance by a deposition process (for instance chemically and/or galvanically or sputtering in any combinations).

In yet another exemplary embodiment, it is possible to implement a buried release layer or structure (for instance made of a waxy component or based on Teflon®) beneath the magnetic foil. Since such a release layer is made of material having an intentionally poor adhesion with regard to the magnetic material of the magnetic foil, cutting a circumferential through hole through the magnetic foil and extending up to the release layer allows to subsequently take out a piece of the magnetic foil above the release layer, to thereby obtain a patterned non-uniform magnetic foil. Thus, in such an embodiment, it is sufficient to mill a certain circumference of the magnetic foil (for instance a ferrite structure), and to subsequently release and remove the separated piece of the magnetic foil.

Connected non-uniform magnetic foils (for instance ferrite layers) formed in this way may be used for manufacturing an inductance or a shielding for shielding disturbing electromagnetic signals between conductive traces of the component carrier (in particular interlayer as well as lateral traces).

In a nutshell, an exemplary embodiment introduces a subtractive method of processing a magnetic layer on a carrier for the manufacture of a component carrier with an embedded non-uniform magnetic foil. With such an architecture, it is possible to also form non-continuous (i.e. separate) magnetic structures in a component carrier such as a printed circuit board. Due to the described embodiment of the manufacturing method, in which the magnetic foil is first connected with the stack by laminating and is patterned later, no issues concerning positioning and registration of the various structures occur. For instance, this allows embedding one or more magnetic layers in a component carrier for shielding purposes and/or for the manufacture of embedded inductors. Corresponding component carriers may also be manufactured in a highly compact way.

Figure 4:
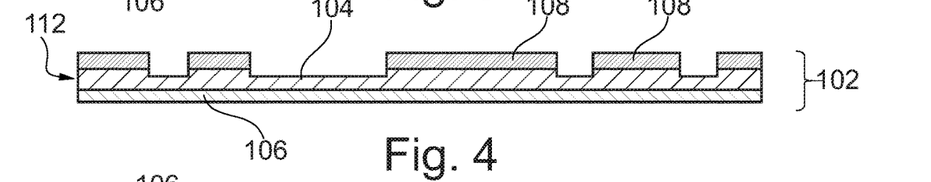
Figure 5:
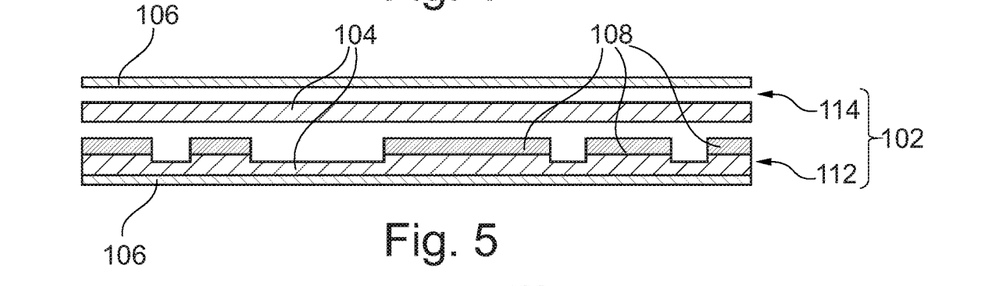
Figure 6:
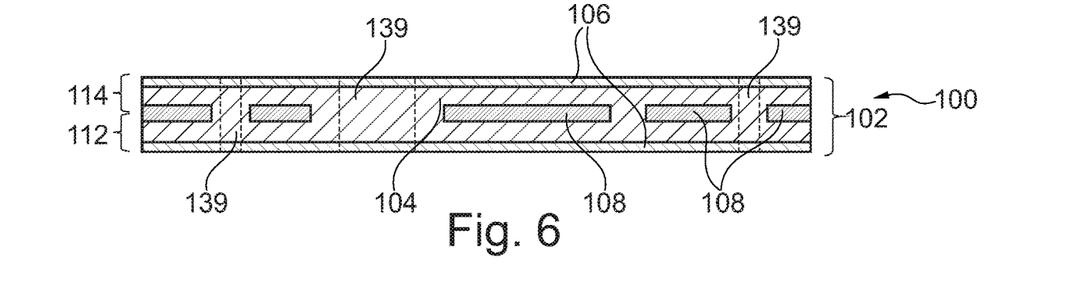

FIG. 1 to FIG. 6 illustrate cross-sectional views of structures obtained during manufacturing a component carrier 100, shown in FIG. 6, according to an exemplary embodiment of the invention.

Figure 1:
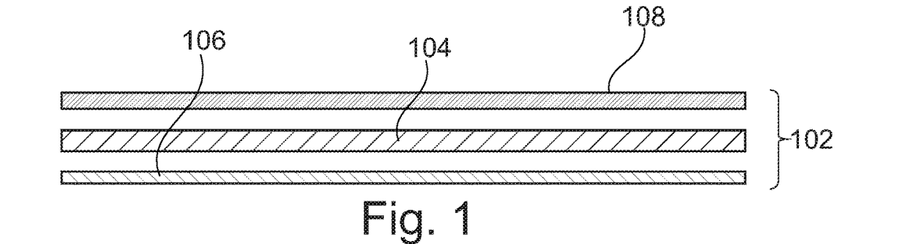
FIG. 1, FIG. 2, FIG. 3, FIG. 4, FIG. 5 and FIG. 6 illustrate cross-sectional views of structures obtained during manufacturing a component carrier, according to an exemplary embodiment of the invention.

Referring to FIG. 1, still separate constituents of a stack 102 to be formed are shown. These constituents comprise an electrically conductive layer structure 106 (here embodied as a copper foil), an electrically insulating layer structure 104 (here embodied as a resin or prepreg foil) and a magnetic foil 108. In the shown embodiment, the magnetic foil 108 may be made of ferrite, p-metal, or may be a foil composed of a non-magnetic polymer matrix with magnetic particles (for instance ferrite particles) therein. The latter mentioned composite foil has the advantage of being properly bendable and having appropriate properties for being integrated in a component carrier 100. For instance in order to provide a proper shielding function against electromagnetic radiation in the high-frequency regime, the magnetic material of the magnetic foil 108 may have a relative magnetic permeability $\mu_r$ of for instance 50 to 500, up to 10,000 or even 100,000 or more. The magnetic material may have soft magnetic or ferrite-like properties. All layers shown in FIG. 1 (see reference numerals 104, 106, 108) may be of panel size.

Figure 2:
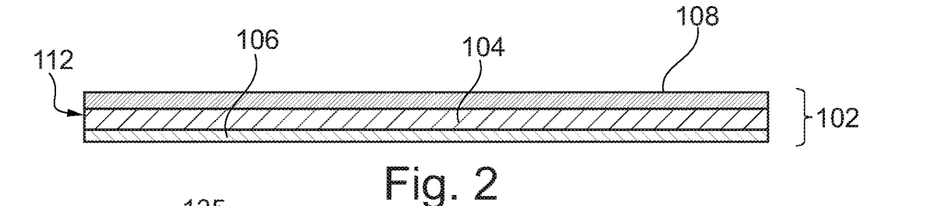

In order to obtain the structure shown in FIG. 2, the individual layers shown in FIG. 1 may be connected by lamination, i.e., by applying mechanical pressure and/or heat. Thereby, a first portion 112 of connected stack 102 composed of the electrically conductive layer structure 106, the electrically insulating layer structure 104, and the magnetic foil 108 is obtained. The magnetic foil 108 may be bendable in its configuration according to FIG. 1 prior to integrating the magnetic foil 108 in the stack 102. The stack 102 may be flexible or rigid depending on the materials that have been employed and/or on the build-up end thickness. By lamination, previously at least partially uncured material of the electrically insulating layer structure 104 has been cured and thereby passive to be hardened, so that the first portion 112 of the stack 102 may be provided with some rigidity. In case of the lamination with a layer of liquid crystal polymer (LCP) or polyimide, the construct or stack 102 is passive to remain flexible and to be used as a flexible PCB.

Figure 3:
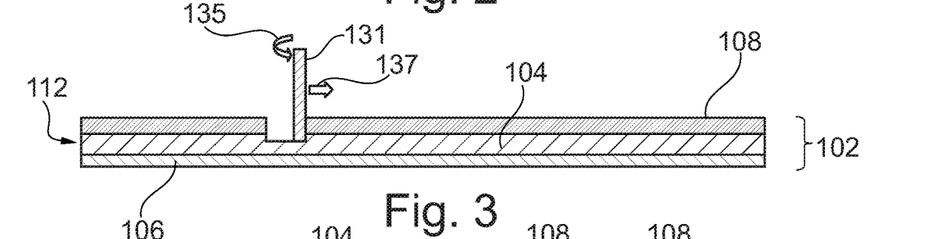

Referring to FIG. 3, the (here still continuous) magnetic surface layer of the stack 102 as well as a portion of the underlying electrically insulating layer structure 104 undergo a depth milling treatment using a milling tool 131. The milling tool 131 is capable of rotating, see arrow 135, and can be moved along a controllable (in particular two-dimensional or three-dimensional) path (see reference numeral 137) under control of a control unit such as a processor (not shown). In other words, the magnetic foil 108 is patterned by depth milling to thereby manufacture a non-uniform magnetic foil 108 by removing material of the magnetic foil 108 by mechanical abrasion.

The patterning of the magnetic material can be also done simply by drilling the stack 102 with through holes instead of depth milling, or in combination with depth drilling. This process is not shown in the figures but it can be easily understood from the considerations of FIG. 3 to FIG. 6. The drilled holes in the stack 102 are afterwards filled in with epoxy resin, and there will be a situation similar to FIG. 6. After this process, the stack 102 may be drilled again exactly on the cleared spaces on the magnetic material with a drill bit or laser to open a hole with a smaller diameter (see reference numeral 139). Such through-holes can be plated with a galvanic copper processes. Such a process may be called via-in-via.

The described patterning procedure may be carried out in a way to maintain an integral connected magnetic foil 108 having through holes in an interior thereof and at a lateral edge thereof. It is however alternatively also possible to remove part of the material of the magnetic foil 108 by depth milling to thereby separate the magnetic foil 108 into multiple separate islands. In both alternatives, there are no issues in terms of registration accuracy, since the magnetic foil 108 has been connected as a complete layer with the layer structures 104, 106 and has only been rendered non-uniform by patterning later.

Advantageously, the patterning of the magnetic foil 108 by depth milling may also allow simultaneously forming one or more alignment markers (see reference numeral 133 in FIG. 7) of magnetic material of the magnetic foil 108. The definition of the patterned portions of the magnetic foil 108 for a magnetic task and the definition of such alignment markers 133 in a common mechanical abrasion process has the specific advantage of further increasing the positional accuracy of the manufactured component carrier 100 and its constituents relative to one another.

In another embodiment, a pre-perforated magnetic foil 108 may be laminated on layer structures 104, 106, which may already comprise a registration marker.

Referring to FIG. 4, a structure is shown which is obtained after completion of the depth milling procedure. The depth milling procedure may remove magnetic material from the magnetic foil 108 specifically in sections where magnetic material is not desired for the functionality of the component carrier 100.

Referring to FIG. 5, the first portion 112 of the stack 102 as shown in FIG. 4 and further constituents of a second portion 114 of the stack 102 are shown. These further constituents comprise a further electrically conductive layer structure 106 (here embodied as a copper foil), and a further electrically insulating layer structure 104 (here embodied as a resin or prepreg foil).

Referring to FIG. 6, the mentioned constituents of the second stack 114 are laminated on the first portion of the stack 102 with the magnetic foil 108 in between. More specifically, this lamination procedure is carried out so that the further electrically insulating layer structure 104 is connected with the patterned magnetic foil 108 as well as with exposed portions of electrically insulating layer structure 104 of the first portion 112. Lamination may be accomplished by applying mechanical pressure and/or heat. By lamination, previously at least partially uncured material of the further electrically insulating layer structure 104 is cured.

As a result of this manufacturing process, the plate-shaped lamination-type component carrier 100 (which is here embodied as a printed circuit board, PCB) as shown in FIG. 6 is obtained. The component carrier 100 comprises the stack 102 composed of the plurality of electrically insulating layer structures 104 and the plurality of electrically conductive layer structures 106 as well as of the patterned and thus non-uniform magnetic foil 108 integrated in the stack 102. Due to the two lamination procedures, the magnetic foil 108 is securely sandwiched between the lower first portion 112 of the stack 102 and the upper second portion 114 of the stack 102.

Depending on the processing of the magnetic foil 108, the component carrier 100 may have an integrated magnetic function, for instance an electromagnetic radiation shielding function, an inductor function, a magnetic core function, etc.

As indicated schematically by reference numeral 139 in FIG. 6, it is possible to form one or more through holes extending between two opposing main surfaces of the component carrier 100 (and/or to form one or more blind holes extending from one of the two opposing main surfaces of the component carrier 100). Such through holes (and/or blind holes) may extend through the patterned magnetic foil 108 so as to be electrically decoupled therefrom. By laterally spacing the holes 139 with regard to the magnetic foil 108, a reliable electric decoupling may be ensured so that the electric contacting between the individual layers is not deteriorated by the presence of the magnetic foil 108. It is then possible to at least partially fill such through holes and/or blind holes with electrically conductive material (for instance by copper material which may be deposited by plating, electroless deposition, galvanically, etc.) to provide vertical through-connections (see reference numeral 110 in FIG. 20) for interconnecting electrically conductive layer structures 106, embedded components (see reference numeral 116 in FIG. 27), etc., of the component carrier 100. The mentioned holes 139 can be formed by drilling (for instance mechanical drilling, laser drilling, etc.).

Figure 7:
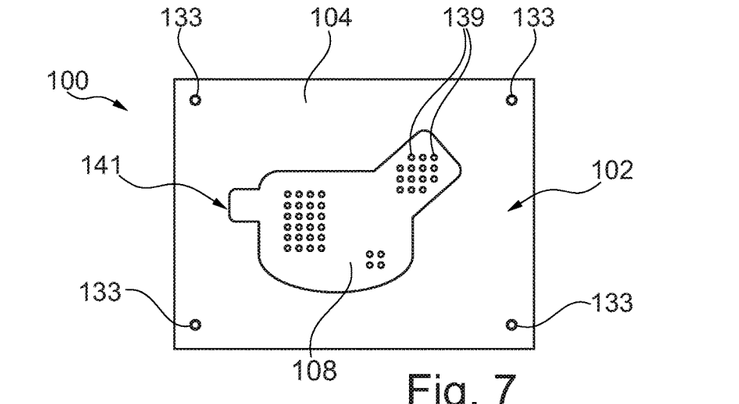
FIG. 7 illustrates a plan view of a component carrier according to an exemplary embodiment of the invention.

FIG. 7 illustrates a plan view of a component carrier 100 according to an exemplary embodiment of the invention. In the component carrier 100 according to FIG. 7, a non-uniform magnetic foil 108 is shown which is composed of five separate islands, i.e. one central electromagnetic radiation shielding structure 141 having several holes 139, and four alignment markers 133 of magnetic material formed in corner regions of component carrier 100 and simultaneously formed from the same magnetic foil 108 as the central electromagnetic radiation shielding structure 141.

Figure 11:
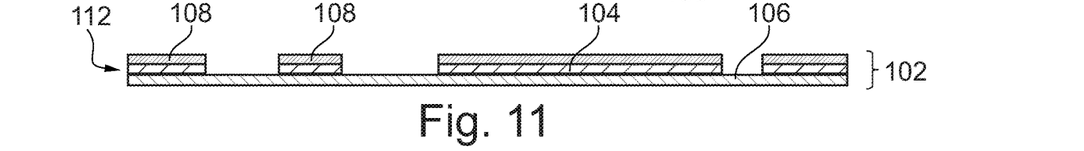
Figure 12:
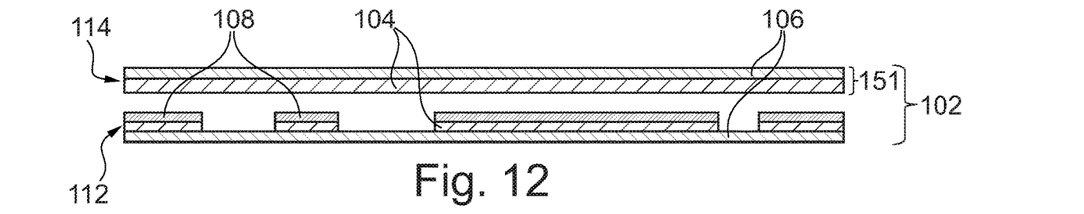
Figure 13:
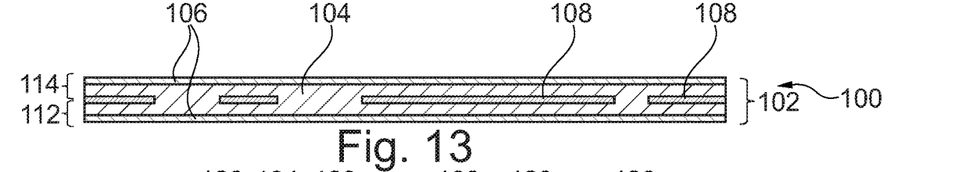

FIG. 8 to FIG. 13 illustrate cross-sectional views of structures obtained during manufacturing a component carrier 100, shown in FIG. 13, according to an exemplary embodiment of the invention.

Figures 8, 9:
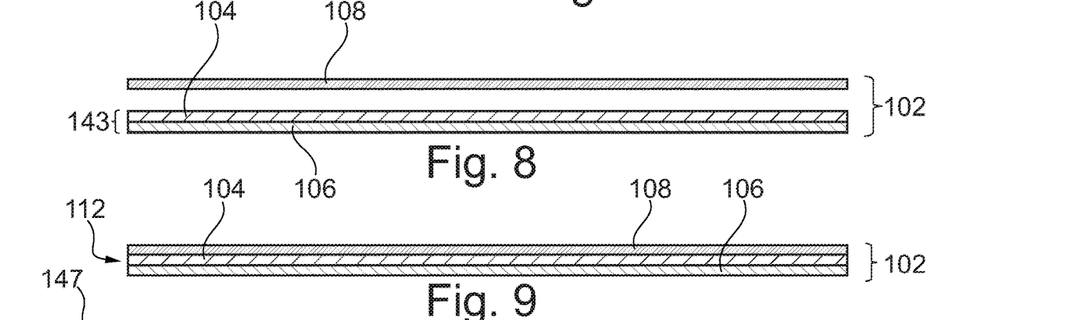
FIG. 8, FIG. 9, FIG. 10, FIG. 11 FIG. 12 and FIG. 13 illustrate cross-sectional views of structures obtained during manufacturing a component carrier, according to an exemplary embodiment of the invention.

Referring to FIG. 8, a resin coated copper (RCC) foil 143 is arranged beneath a magnetic foil 108. The RCC foil 143 is composed of an electrically conductive layer structure 106 (here embodied as a copper foil) which is already covered on a main surface thereof with a resin layer as electrically insulating layer structure 104. The resin layer is still uncured, and will be cured later during lamination.

In order to obtain the structure shown in FIG. 9, the constituents of the stack 102 shown in FIG. 8 are interconnected by lamination, i.e. the application of pressure and/or heat, thereby curing further electrically insulating layer structure 104. As a result, the integral first portion 112 of the layer stack 102 shown in FIG. 9 is obtained.

Figure 10:
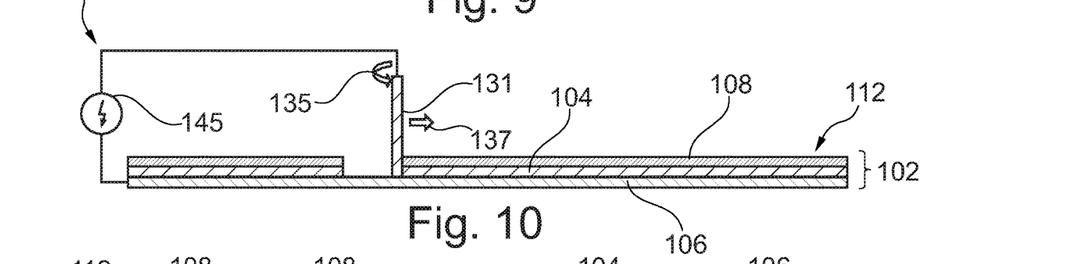

Referring to FIG. 10, the first portion 112 of the layer stack 102 is patterned by contact milling, wherein electrically conductive layer structure 106 serves as a stop layer of the milling procedure. As can be taken from FIG. 10, an electric circuit 147 is provided which allows an electric current flow only when a tip of electrically conductive milling tool 131 contacts electrically conductive layer structure 106, which can be detected by an electric detection unit 145 (such as an ammeter or a capacitance bridge). In the event of signal detection, the milling procedure may either be terminated, or the milling tool 131 may be raised to prevent milling of electrically conductive layer structure 106. Thereby, it can be precisely ensured that the electrically conductive layer structure 106 is not damaged by the milling of the magnetic foil 108 (and optionally of the underlying electrically insulating layer structure 104). Thus, a highly advantageous depth control may be obtained by the milling procedure according to FIG. 10. As a consequence, the readily manufactured component carrier 100 has precisely defined properties and has a high mechanical and electrical reliability.

FIG. 11 shows a structure obtained when the milling procedure is completed and the magnetic foil 108 is patterned in accordance with a desired magnetic application, so that non-uniformity of the magnetic foil 108 has been established.

Referring to FIG. 12, the first portion 112 of the stack 102 as shown in FIG. 11 and a constituent of the second portion 114 of the stack 102 are shown. This constituent comprises a further RCC (resin coated copper) foil 151 composed of a further electrically conductive layer structure 106 (here embodied as a copper foil), and a further electrically insulating layer structure 104 (here embodied as a still uncured resin layer).

Referring to FIG. 13, the mentioned constituent of the second stack 114 is laminated on the first portion of the stack 102 with the magnetic foil 108 on an exposed surface thereof. More specifically, this lamination procedure is carried out so that the further electrically insulating layer structure 104 is connected with the patterned magnetic foil 108 as well as with exposed portions of electrically insulating layer structure 104 of the first portion 112. Lamination may be accomplished by applying mechanical pressure and/or heat. By lamination, the previously at least partially uncured material of the further electrically insulating layer structure 104 has been cured.

Figure 17:
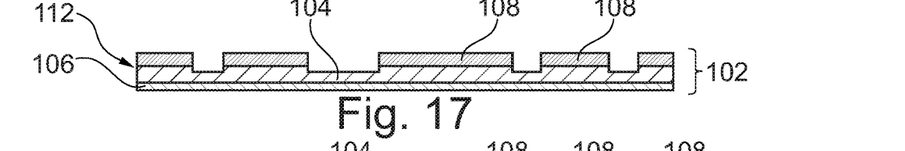
Figure 18:
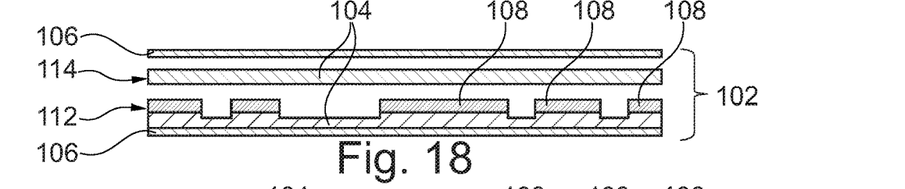
Figure 19:
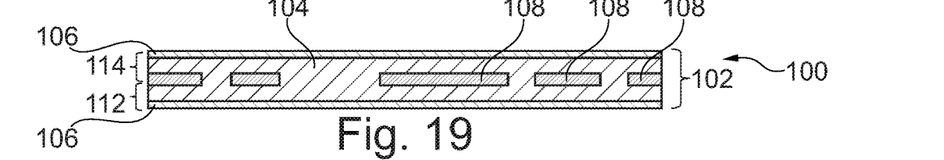

FIG. 14 to FIG. 19 illustrate cross-sectional views of structures obtained during manufacturing a component carrier 100, shown in FIG. 19, according to an exemplary embodiment of the invention.

Figure 14:
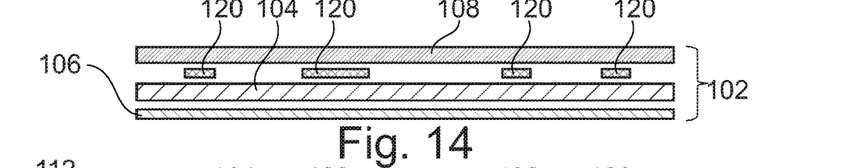
FIG. 14, FIG. 15, FIG. 16, FIG. 17 FIG. 18 and FIG. 19 illustrate cross-sectional views of structures obtained during manufacturing a component carrier, according to an exemplary embodiment of the invention.

Referring to FIG. 14, the magnetic foil 108 is arranged above several portions of a release structure 120 which are sandwiched between electrically conductive layer structure 106 (for instance a copper foil) and electrically insulating layer structure 104 (for instance a resin foil or a prepreg foil) on a bottom side and the magnetic foil 108 on a top side. For instance, the release structure 120 may be a patterned layer with non-adhesive properties with regard to the material of the constituents with reference numerals 104, 108. Such a release structure 120 may for instance be a waxy component (which may be based on calcium stearate) or polytetrafluoroethylene (PTFE) based material which can be applied in the form of a paste, for instance by screen printing. The release structure 120 may have the property to be non-adhesive with regard to both magnetic foil 108 and component carrier materials, in particular copper, epoxy resin, reinforcing glass fibers, etc. The order between structures 120 and 104 may be changed before the lamination process. In this case the release structure 120 (for instance a layer) can be applied on the copper foil (more generally electrically conductive layer structure 106) and the stopping layer for the laser process (see laser cutting tool 122) will be the electrically conductive layer structure 106.

Figure 15:
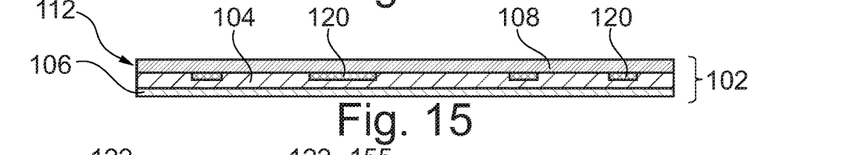

Referring to FIG. 15, the constituents described referring to FIG. 14 may be interconnected by laminating, i.e. the application of pressure and/or heat. As a result, first portion 112 of the stack 102 is obtained.

Figure 16:
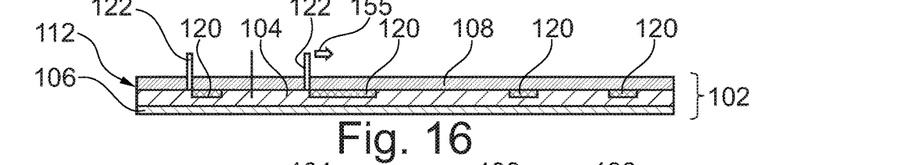

Referring to FIG. 16, annular through-holes may be formed extending through the magnetic foil 108 and extending up to the release structure 120 by a laser cutting tool 122. Each through-hole surrounds, in a top view, a corresponding island of the release structure 120. As indicated by reference numeral 155, the laser cutting tool 122 may be movable so as to cut out pieces of the magnetic foil 108 above the respective portions of the release structure 120. As an alternative to laser cutting, the annular through-holes may also be formed by mechanically cutting, etc.

The structure shown in FIG. 17 may be obtained by removing the cut out portions of the magnetic foil 108 within the annular through-holes and above the release structures 120. Due to the non-adhesive property of the material of the release structures 120, these magnetic portions of pieces may be simply taken out. The procedure of releasing cut-off parts may be supported by ultrasound vibration. If desired or required, remaining material of the release structures 120 may then be removed, for instance by stripping. By this procedure, non-uniform magnetic foil 108 is obtained.

Since the structure obtained according to FIG. 17 substantially corresponds to the structure obtained according to FIG. 4, further processing according to FIG. 18 may be accomplished as described above referring to FIG. 5, and further processing according to FIG. 19 may be accomplished as described above referring to FIG. 6. The component carrier 120 according to FIG. 19 may additionally undergo a copper structuring and interconnection processing as known by those skilled in the art of printed circuit boards.

Figure 20:
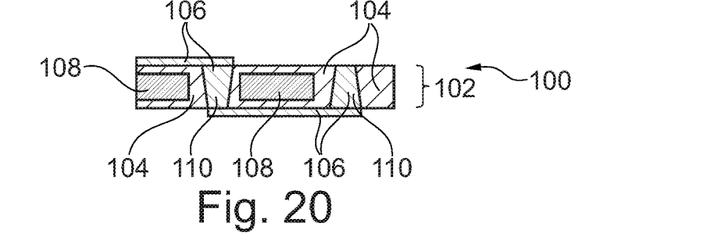
FIG. 20 illustrates a cross-sectional view of a portion of a component carrier according to an exemplary embodiment of the invention.

FIG. 20 illustrates a cross-sectional view of a portion of a component carrier 100 according to an exemplary embodiment of the invention. The component carrier 100 according to FIG. 20 further comprises vertical through-connections 110 extending through the stack 102 and the magnetic foil 108. The vertical through-connections 110 are separated from the magnetic foil 108 laterally by material of the electrically insulating layer structures 104. In the shown embodiment, the vertical through-connections 110 are laser copper vias. They are formed by firstly cutting holes in the stack 102 between adjacent islands or portions of the magnetic foil 108 by laser processing, and by subsequently filling copper material in the formed holes (for instance by plating, electroless deposition, a galvanic process, etc.).

Figures 21, 22, 23:
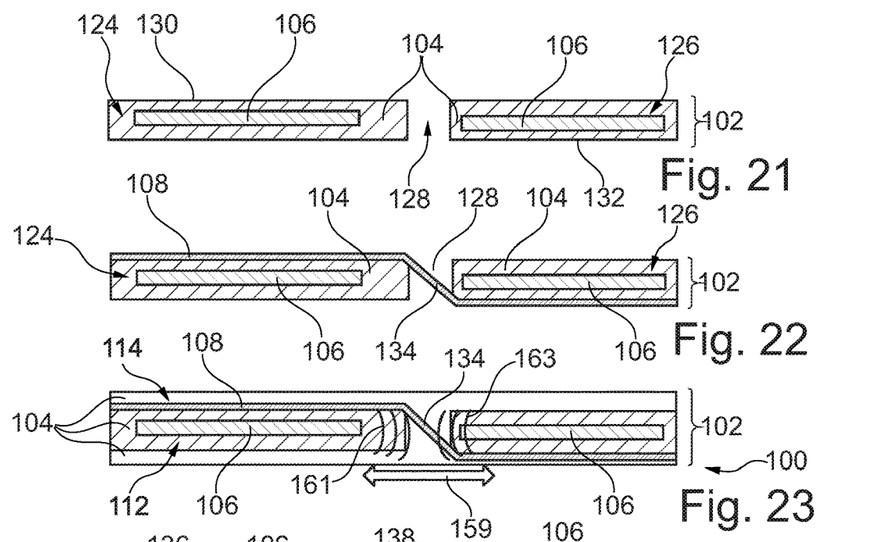
FIG. 21, FIG. 22 and FIG. 23 illustrate cross-sectional views of structures obtained during manufacturing a component carrier, according to an exemplary embodiment of the invention.

FIG. 21 to FIG. 23 illustrate cross-sectional views of structures obtained during manufacturing a component carrier 100, shown in FIG. 23, according to an exemplary embodiment of the invention.

Referring to FIG. 21, a first body 124 and a second body 126 are provided and are arranged side by side, both comprising component carrier material. In the shown embodiment, each of the first body 124 and the second body 126 comprises an electrically conductive layer structure 106 (such as a copper foil, wherein a component 116 may be embedded there as well, see FIG. 27) embedded in dielectric material of electrically insulating layer structures 104 (such as prepreg or FR4). In addition or alternatively to the embedded electrically conductive layer structures 106, it is also possible to embed a component (such as an electromagnetic radiation generating component or an electromagnetic radiation sensitive component) in the respective first body 124 and/or second 126. The first body 124 and the second body 126 are laterally spaced by a gap 128. The shown arrangement of the first body 124 and the second body 126 is made in preparation of a subsequent placement of a magnetic foil 108 between an upper main surface 130 of the first body 124, the gap 128 and a lower main surface 132 of the second body 126. For instance, the first body 124 and the second body 126 may be formed by cutting a core in two pieces or by forming a slit-shaped recess as the gap 128 in an integral core (or other base body).

Referring to FIG. 22, the flexible or bendable magnetic foil 108 is three-dimensionally bent to thereby guide the magnetic foil 108 from the upper main surface 130 of the first body 124 through the gap 128 up to the lower main surface 132 of the second body 126 to thereby three-dimensionally bend the magnetic foil 108. As a result, a central portion 134 of the magnetic foil 108 is slanted in the gap 128 with regard to the main surfaces 130, 132. The magnetic foil 108 may either be a continuous foil or may be already pre-patterned or pre-structured.

Referring to FIG. 23, further electrically insulating layer structures 104 of uncured material (for instance resin or prepreg) may be placed on top and below the structure shown in FIG. 22. Subsequently, all mentioned constituents can be interconnected by lamination, i.e. the application of pressure and/or heat. As a result, the cavity or gap 128 is filled with cured resin. Thereby, the three dimensionally bent flexible magnetic foil 108 is secured in place in the three-dimensionally bent configuration. As a result, the component carrier 100 according to FIG. 23 is obtained.

In this embodiment, the three-dimensionally bent (and optionally patterned) magnetic foil 108 is configured for shielding electromagnetic radiation from propagating from first portion 112 of the stack 102 to second portion 114 of the stack 102, or vice versa. As indicated by reference numeral 159, the central portion 134 of magnetic foil 108 provides for a lateral shielding of electromagnetic radiation 161, 163 which may propagate from the first body 124 (for instance from its electrically conductive layer structure 106 and/or a component 116 embedded therein) to the second body 126 (for instance to its electrically conductive layer structure 106 and/or a component 116 embedded therein), and/or vice versa.

Figure 24:
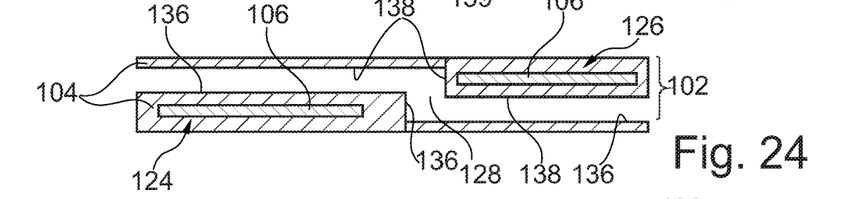
FIG. 24, FIG. 25 and FIG. 26 illustrate cross-sectional views of structures obtained during manufacturing a component carrier according to an exemplary embodiment of the invention.
Figure 25:
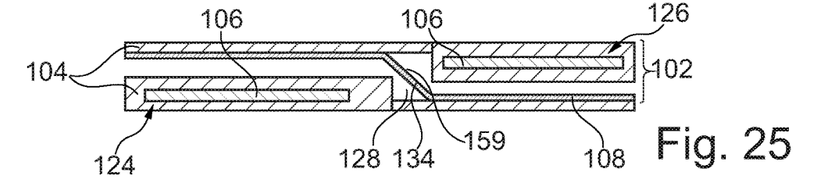
Figure 26:
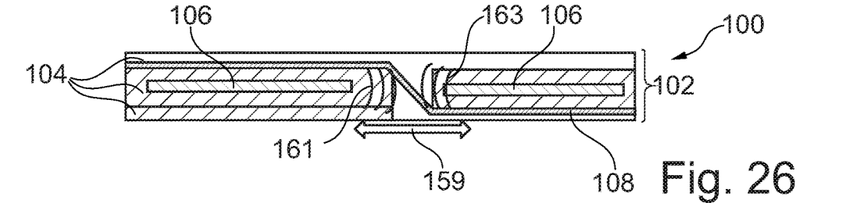

FIG. 24 to FIG. 26 illustrate cross-sectional views of structures obtained during manufacturing a component carrier 100, shown in FIG. 26, according to an exemplary embodiment of the invention.

Referring to FIG. 24, the first body 124 and the second body 126 are vertically spaced and are each formed with a respective one of two cooperating surface profiles 136, 138 which are here embodied as steps. Similar to the embodiment according to FIG. 21 to FIG. 23, also in the present embodiment the first body 124 and the second body 126 together form the stack 102 when assembled and interconnected.

Referring to FIG. 25, the magnetic foil 108 is guided along both surface profiles 136, 138 of the bodies 124, 126 so as to be three-dimensionally bent and thereby rendered non-uniform. A central portion 134 of the magnetic foil 108 is guided along an empty volume 159 (corresponding to gap 128) which remains between the assembled bodies 124, 126.

Referring to FIG. 26, the constituents according to FIG. 25 are then connected by laminating, i.e. the application of pressure and/or heat. Thereby, previously uncured material of the electrically insulating layer structures 104 becomes cured, and resin also flows into the empty volume 159 to fill up the latter. As described above referring to FIG. 23, also the component carrier 100 according to FIG. 26 provides a lateral shielding function, thereby improving the EMI performance of the component carrier 100.

Figure 27:
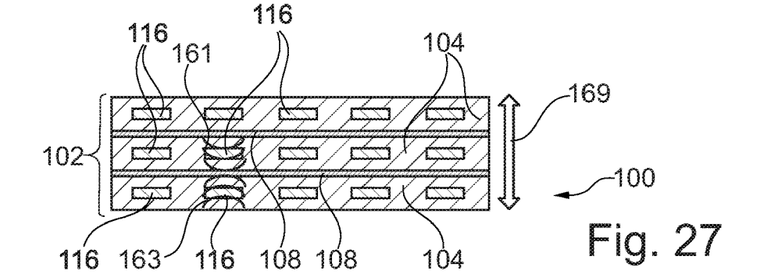
FIG. 27 illustrates a cross-sectional view of a component carrier according to an exemplary embodiment of the invention.

FIG. 27 illustrates a cross-sectional view of a component carrier 100 according to an exemplary embodiment of the invention. The component carrier 100 according to FIG. 27 comprises multiple embedded components 116. For instance, the components 116 may be electronic chips for high-frequency applications, and may for instance be configured as signal processing component, voltage converter, microprocessor, logic chip, etc. These and other types of components 116 may generate electromagnetic radiation 161, 163. If such electromagnetic radiation 161, 163 propagates to other components 116 being sensitive with regard to such electromagnetic radiation 161, 163, this may disturb the operation as well as decrease the performance of such components 116. In order to prevent such undesired effects, two patterned and hence non-uniform magnetic foils 108 are embedded as horizontal layers in stack 102 to provide for an interlayer shielding, see reference numeral 169.

FIG. 28 to FIG. 31 illustrate different views of a component carrier 100 according to an exemplary embodiment of the invention. The application described referring to FIG. 28 to FIG. 31 relates to a ferrite bead on PCB balun and chokes. A ferrite bead or ferrite choke is a passive electric component that suppresses high frequency noise in electronic circuits.

Figure 28:
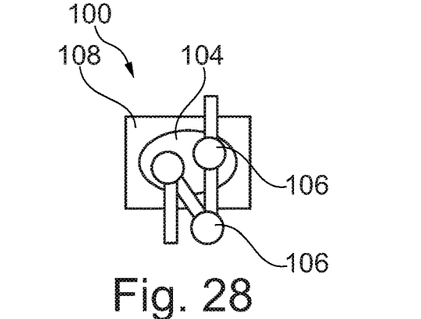
FIG. 28, FIG. 29, FIG. 30 and FIG. 31 illustrate different views of a component carrier according to an exemplary embodiment of the invention.
Figure 29:
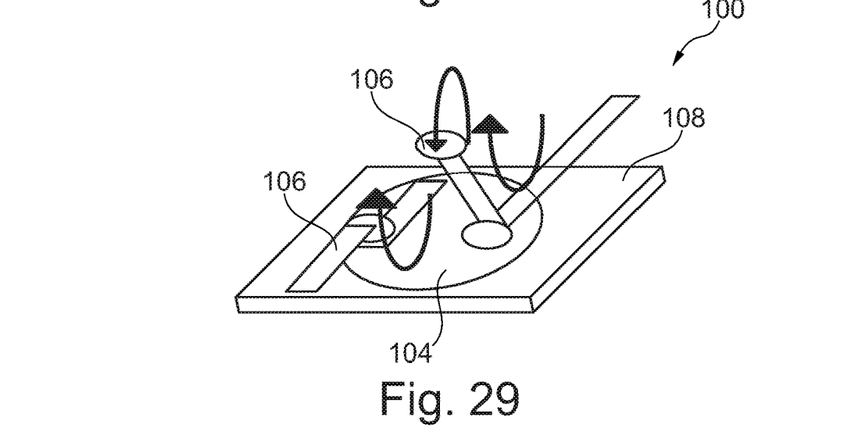
Figure 30:
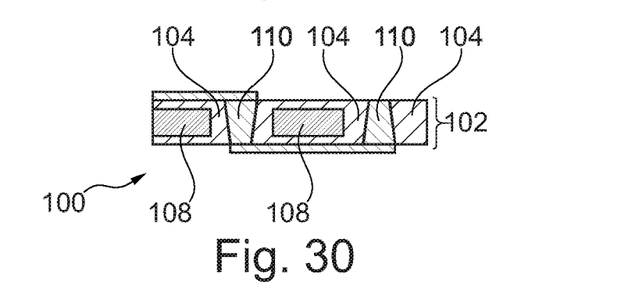

Referring to FIG. 28, a top view of a patterned non-uniform magnetic foil 108 is shown having a through hole through which electrically conductive layer structures 106 in the form of copper vias are guided and are connected to copper traces. FIG. 29 shows a corresponding three-dimensional view. FIG. 30 shows a cross-sectional view schematically illustrating the described coupling.

Figure 31:
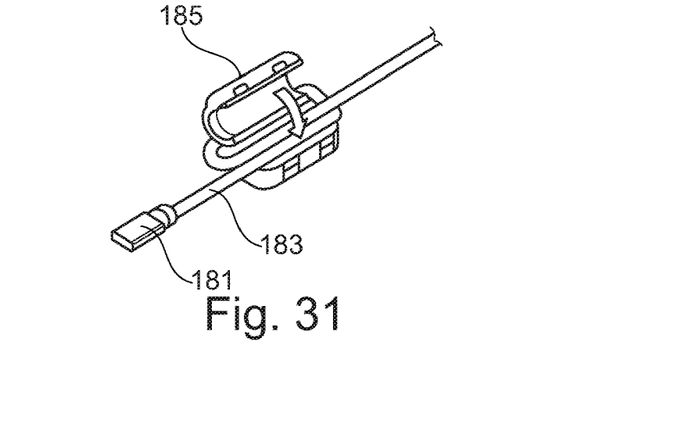

FIG. 31 shows a corresponding device with a plug 181 connected to a cable 183 which is wound and guided through a connector 185 (which may for instance be connected to a printer). However, many other applications of the concept illustrated schematically referring to FIG. 28 to FIG. 30 are possible as well.

It should be noted that the term "comprising" does not exclude other elements or steps and the "a" or "an" does not exclude a plurality. Also elements described in association with different embodiments may be combined.

It should be further understood that when the phrase "at least one of A and B" is included in a claim, where the labels A and B represent a recitation of limitations or features, the phrase "at least one of A and B" means at least one of A or B. It should be further understood that "at least one of A or B" includes the limitations or features of: A alone; B alone; any positive whole number of A alone; any positive whole number of B alone; and any combination of a positive whole number of A with a positive whole number of B.

Implementation of the invention is not limited to the preferred embodiments shown in the figures and described above. Instead, a multiplicity of variants are possible which use the solutions shown and the principle(s) according to the invention even in the case of fundamentally different embodiments.

We claim:

1. A component carrier being a printed circuit board, an organic interposer, or an integrated circuit substrate, comprising:
   a stack comprising a plurality of electrically insulating layer structures and a plurality of electrically conductive layer structures; and
   a non-uniform magnetic foil integrated in the stack,
   wherein the non-uniform magnetic foil is configured as an arrangement of multiple separate island structures;
   wherein the non-uniform magnetic foil comprises a polymer matrix and magnetic particles, and wherein at least one separate island structure of the multiple separate island structures comprises a part of the polymer matrix and at least two magnetic particles.

2. The component carrier according to claim 1, further comprising at least one of the following features:
   wherein the non-uniform magnetic foil is a patterned magnetic foil;
   wherein the non-uniform magnetic foil is a three-dimensionally bendable or bent magnetic foil.

3. The component carrier according to claim 1, further comprising at least one vertical through-connection extending through at least part of the stack and extending through the non-uniform magnetic foil.

4. The component carrier according to claim 1, further comprising at least one of the following features:
   wherein the non-uniform magnetic foil comprises a soft magnetic material and/or a ferrite material;
   wherein the non-uniform magnetic foil is arranged between a first portion of the stack and a second portion of the stack;
   wherein the non-uniform magnetic foil is configured for shielding electromagnetic radiation from at least one of the group consisting of propagating within the component carrier, propagating between the component carrier and an environment;
   wherein the component carrier comprises an inductor, wherein the non-uniform magnetic foil forms part of the inductor.

5. The component carrier according to claim 1, further comprising at least one of the following features:
   wherein at least one of the electrically conductive layer structures comprises at least one of the group consisting of copper, aluminum, nickel, silver, gold, palladium, and tungsten, any of the mentioned materials being optionally coated with graphene;
   wherein at least one of the electrically insulating layer structures comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
   wherein the component carrier is shaped as a plate;
   wherein the component carrier is configured as a laminate-type component carrier.

6. The component carrier according to claim 1, wherein the non-uniform magnetic foil comprises a permanent magnetic material.

7. A method of manufacturing a component carrier being a printed circuit board, an organic interposer, or an integrated circuit substrate, the method comprising:
   connecting a stack of a plurality of electrically conductive layer structures and a plurality of electrically insulating layer structures; and
   non-uniformly integrating a uniform magnetic foil in the stack to provide a non-uniform magnetic foil by
      connecting the uniform magnetic foil on at least one of the layer structures; and
      subsequently removing part of the uniform magnetic foil, wherein removing part of the uniform magnetic foil comprises separating the uniform magnetic foil into multiple separate island structures,
      wherein the non-uniform magnetic foil comprises a polymer matrix and magnetic particles, and wherein at least one separate island structure of the multiple separate island structures comprises a part of the polymer matrix and at least two magnetic particles.

8. The method according to claim 7, further comprising at least one of the following features:
   wherein the non-uniform magnetic foil is formed by removing material of the uniform magnetic foil by mechanical abrasion;
   wherein the non-uniform magnetic foil is formed by milling;
   wherein the non-uniform magnetic foil is formed by laser processing.

9. The method according to claim 7, wherein the method comprises processing the uniform magnetic foil by:
   arranging part of the uniform magnetic foil on or above a release structure;
   forming an annular through-hole through the uniform magnetic foil extending at least up to the release structure; and
   removing a portion of the uniform magnetic foil within the annular through-hole.

10. The method according to claim 9, wherein the method comprises forming the annular through-hole by one of the group consisting of mechanically cutting and laser cutting.

11. The method according to claim 7, wherein the method comprises processing the uniform magnetic foil by:
   providing a first body and a second body each comprising component carrier material; and
   guiding the uniform magnetic foil along one of the bodies through a gap between the bodies up to the other of the bodies to thereby three-dimensionally bend the uniform magnetic foil to provide the non-uniform magnetic foil.

12. The method according to claim 11, further comprising at least one of the following features:
   wherein the uniform magnetic foil is guided from an upper main surface of the first body via the gap to a lower main surface of the second body so that a central portion of the uniform magnetic foil is slanted in the gap with regard to the main surfaces;

wherein the first body and the second body are each formed with a respective one of two cooperating surface profiles, and wherein the uniform magnetic foil is guided along at least part of both surface profiles so as to be three-dimensionally bent to provide the non-uniform magnetic foil;

wherein the first body and the second body together form at least part of the stack when assembled.

13. The method according to claim 7, wherein the method further comprises forming at least one electrically conductive through-connection extending through at least part of the stack and extending through the non-uniform magnetic foil, wherein the through-connection is laterally spaced with regard to the non-uniform magnetic foil and thereby electrically decoupled from the non-uniform magnetic foil.

14. The method according to claim 7, wherein the method further comprises laminating the non-uniform magnetic foil on a first portion of the stack and subsequently laminating a second portion of the stack on the first portion of the stack and on the non-uniform magnetic foil.

15. The method according to claim 7, wherein the method comprises providing the uniform magnetic foil being flexibly bendable prior to integrating the uniform magnetic foil as the non-uniform magnetic foil in the stack.

16. The method according to claim 7, further comprising:
filling a space between the multiple separate island structures using a further electrically insulating layer structure including resin or prepreg.

17. The method according to claim 7,
wherein the non-uniform magnetic foil comprises a permanent magnetic material.

\* \* \* \* \*